United States Patent
Girotra et al.

(10) Patent No.: US 7,696,091 B2
(45) Date of Patent: Apr. 13, 2010

(54) METHOD OF FORMING A SILICON LAYER AND METHOD OF MANUFACTURING A DISPLAY SUBSTRATE BY USING THE SAME

(75) Inventors: Kunal Girotra, Yongin-si (KR); Byoung-June Kim, Seongnam-si (KR); Sung-Hoon Yang, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 492 days.

(21) Appl. No.: 11/675,935

(22) Filed: Feb. 16, 2007

(65) Prior Publication Data
US 2007/0212827 A1    Sep. 13, 2007

(30) Foreign Application Priority Data
Feb. 17, 2006    (KR) .............. 10-2006-0015517

(51) Int. Cl.
*H01L 21/44*  (2006.01)
(52) U.S. Cl. ............ 438/677; 438/158; 438/159; 438/488; 257/E29.294; 257/E21.079; 257/E21.104; 257/E21.211

(58) Field of Classification Search .......... 438/158, 438/159, 488, 677; 257/E29.003, E29.294, 257/E21.079, E21.104, E21.119, E21.211
See application file for complete search history.

(56) References Cited

U.S. PATENT DOCUMENTS

| | | | | |
|---|---|---|---|---|
| 5,364,816 A | * | 11/1994 | Boos et al. ............... | 438/172 |
| 6,183,655 B1 | * | 2/2001 | Wang et al. .............. | 216/68 |
| 6,861,614 B1 | * | 3/2005 | Tanabe et al. ........... | 219/121.66 |
| 7,067,434 B2 | * | 6/2006 | Colombo et al. ......... | 438/714 |
| 7,514,374 B2 | * | 4/2009 | Tran Quoc et al. ...... | 438/787 |
| 2006/0062914 A1 | * | 3/2006 | Garg et al. .............. | 427/248.1 |

* cited by examiner

*Primary Examiner*—Matthew C Landau
*Assistant Examiner*—Colleen E Snow
(74) *Attorney, Agent, or Firm*—F. Chau & Associates, LLC

(57) ABSTRACT

A method of manufacturing a silicon layer includes pretreating a surface of a silicon nitride layer formed on a substrate through a plasma enhanced chemical vapor deposition method using a first reaction gas including at least one of silicone tetrafluoride ($SiF_4$) gas, a nitrogen trifluoride ($NF_3$) gas, $SiF_4$—$H_2$ gas and a mixture thereof. Then, a silicon layer is formed on the pretreated silicon nitride layer through the plasma enhanced chemical vapor deposition method using a second reaction gas including a mixture of gas including silicon tetrafluoride ($SiF_4$), hydrogen ($H_2$) and argon (Ar).

9 Claims, 10 Drawing Sheets

N2 PLASMA PRETREATMENT (74%)

NF3 PLASMA PRETREATMENT (75%)

SiF4-H2 PLASMA PRETREATMENT (70%)

SiF4 PLASMA PRETREATMENT (72%)

SIF4 PLASMA PRETREATMENT (64%)

H2 PLASMA PRETREATMENT (~50%)

NO PLASMA PRETREATMENT (66%)

METHOD OF FORMING A SILICON LAYER AND METHOD OF MANUFACTURING A DISPLAY SUBSTRATE BY USING THE SAME

CROSS-REFERENCE TO RELATED APPLICATIONS

This application claims priority to Korean Patent Application No. 2006-15517 filed on Feb. 17, 2006, the contents of which are hereby incorporated by reference herein in their entirety.

BACKGROUND OF THE INVENTION

1. Technical Field

The present disclosure relates to a method of forming a silicon layer and a method of manufacturing a display substrate using the same. More particularly, the present disclosure relates to a method of forming a silicon layer, which is capable of improving crystalline fraction and uniform grain distribution of a silicon crystal, and a method of manufacturing a display substrate using the same.

2. Description of the Related Art

The technology for electronic display apparatuses and liquid crystal display apparatuses including a thin film transistor have been significantly improved. For example, a liquid crystal display (LOD) apparatus having an all color display has been devised, so that the LCD apparatus has substantially the same color reproducibility as a cathode ray tube (ORT) display apparatus. A large-screen display substrate includes a thin film transistor using an amorphous silicon (a-Si:H) as a semiconductor layer. The amorphous silicon (a-Si:H) is relatively inexpensive and provides improved electric characteristics for the LCD device, and thus a thin film transistor utilizing the amorphous silicon (a-Si:H) is typically used for an active matrix LCD apparatus as a pixel charge device.

Moreover, to increase contrast ratio, uniformity of color, high brightness viewing angle, and resolution, a display device including an organic light emitting diode and a light emitting diode including a polymer material has been developed.

As a result, the material characteristics of the semiconductor layer used in the thin film transistor for an active matrix display apparatus have been improved. Thus, higher stability and faster charge characteristics than those obtained from a amorphous silicon (a-Si:H) are now needed.

Microcrystalline silicon is a semiconductor material used to form a semiconductor layer. A semiconductor layer formed using microcrystalline cellulose has various characteristics such as high mobility and high stability.

The microcrystalline silicon layer is typically formed through a plasma enhanced chemical vapor deposition process (PECVD) using a mixed gas. However, to use a microcrystalline silicon layer to form the semiconductor layer of the thin film transistor, the silicon crystals of the microcrystalline layer should have increased size, improved uniformity of distribution and improved fraction. Moreover, a larger silicon crystal size is also preferred. However, the size uniformity of the crystals is more significant than the size of the crystals.

The plasma enhanced chemical vapor deposition process used for forming a microcrystalline silicon layer should be an optimized process condition such that a silicon layer having improved electric characteristics compared to an amorphous silicon layer of a thin film transistor is formed. For example, the process conditions of a plasma enhanced chemical vapor deposition process may include a plasma power, a chamber pressure, a temperature of a substrate, an amount of reaction gas, a gap between an electrode and the substrate, a deposition time and so on.

Thus, there is a need for a method of forming a silicon layer, which is capable of improving crystalline fraction and uniform grain distribution of a silicon crystal, and to a method of manufacturing a display substrate using the same.

SUMMARY OF THE INVENTION

Exemplary embodiments of the present invention provide a method of forming a silicon layer capable of improving a silicon crystalline fraction, a crystalline size and a distribution uniformity of the silicon layer.

Exemplary embodiments of the present invention also provide a method of a display substrate including a switching device having improved characteristics via the method of forming the silicon layer.

In accordance with an exemplary embodiment of the present invention, a method of forming a silicon layer is provided. The method includes pretreating a surface of a silicon nitride layer formed on a substrate through a plasma enhanced chemical vapor deposition method using a first reaction gas including at least one gas selected from the group consisting of silicon tetrafluoride ($SiF_4$) gas, a nitrogen trifluoride ($NF_3$) gas, $SiF_4$—$H_2$ gas and a mixture thereof. The method further includes forming a silicon layer on the pretreated silicon nitride layer through a plasma enhanced chemical vapor deposition method using a second reaction gas including a mixture of gas including silicon tetrafluoride ($SiF_4$), hydrogen ($H_2$) and argon (Ar).

The first reaction gas includes the silicon tetrafluoride ($SiF_4$) gas, and the plasma pretreatment is performed under a process condition, in which a plasma power, a chamber pressure, a gap between electrodes, an amount of gas and a pretreatment time are between about 540 to 660 W/cm$^2$, between about 1.1 to 1.3 Torr, between about 16 to 20 mm, between about 270 to 330 sccm and between about 108 to 132 second, respectively. The plasma pretreatment may be proceeded in a process condition, in which a plasma power, a chamber pressure, a gap between electrodes and an amount of gas are about 600 W/cm$^2$, about 1.2 Torr, about 18 mm, about 300 sccm and about 120 second, respectively. Forming a silicon layer is performed under a process condition, in which a plasma power, a chamber pressure, a gap between electrodes, a temperature of a substrate and a ratio of an amount of silicone tetrafluoride ($SiF_4$):hydrogen ($H_2$):argon (Ar) are between about 190 to 230 W/cm$^2$, between about 3 to 4 Torr, between about 16 to 20 mm, between about 198 to 242 degrees and between about 45 to 55; between about 675 to 825; between about 450 to 550, respectively.

The forming of a silicon layer may be performed under a process condition, in which a plasma power, a chamber pressure, a gap between electrodes, a temperature of a substrate and a ratio of an amount of silicone tetrafluoride ($SiF_4$):hydrogen ($H_2$):argon (Ar) are about 210 W/cm$^2$, between about 3 to 5 Torr, about 18 mm, about 220 degrees and about 50:750:500.

The plasma pretreatment and the forming of the silicon layer may be performed in the substantially same chamber, in sequence.

In accordance with an exemplary embodiment of the present invention, a method of manufacturing a display panel is provided. The method includes forming a gate wiring and a gate electrode on a substrate, forming a silicon nitride layer covering the gate wiring and the gate electrode, performing a plasma pretreatment of a surface of the silicon nitride layer through a plasma enhanced chemical vapor deposition method using a first reaction gas including silicone tetrafluoride ($SiF_4$), forming a semiconductor layer including silicon crystals on the pretreated silicon nitride layer through a plasma enhanced chemical vapor deposition method using a second reaction gas including a mixture of gas including silicone tetrafluoride ($SiF_4$), hydrogen ($H_2$) and argon (Ar), and forming a source wiring crossing the gate wiring, a source electrode and a drain electrode on the semiconductor layer.

The method of the display panel may further include forming a passivation layer on the substrate including the source electrode and the drain electrode, and forming an electrode electrically connected to the drain electrode. The plasma pretreatment and the forming of the silicon layer are performed by a 13.56 MHz plasma enhanced chemical vapor deposition reactor.

According to the methods of the exemplary embodiments of the present invention, the display substrate may have a semiconductor layer having improved characteristics such as a field effect mobility and a critical voltage stability than an amorphous silicon layer.

BRIEF DESCRIPTION OF THE DRAWINGS

Exemplary embodiments of the present invention can be understood in more detail from the following description taken in conjunction with the accompanying drawings wherein.

DESCRIPTION OF THE EXEMPLARY EMBODIMENTS

Figure 1:
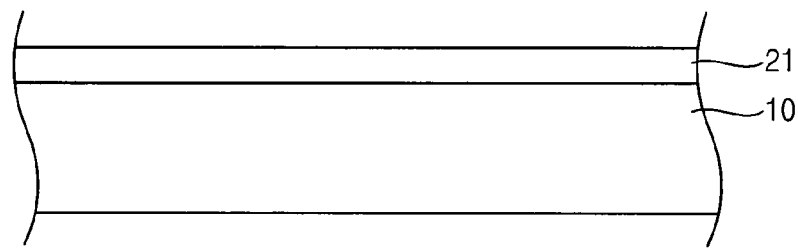
FIGS. 1 to 4 are cross-sectional views illustrating a method of forming a silicon layer in accordance with an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, exemplary embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Hereinafter, the exemplary embodiments of the present invention will be explained in detail with reference to the accompanying drawings.

Method of Manufacturing Silicon Layer

Figure 2:
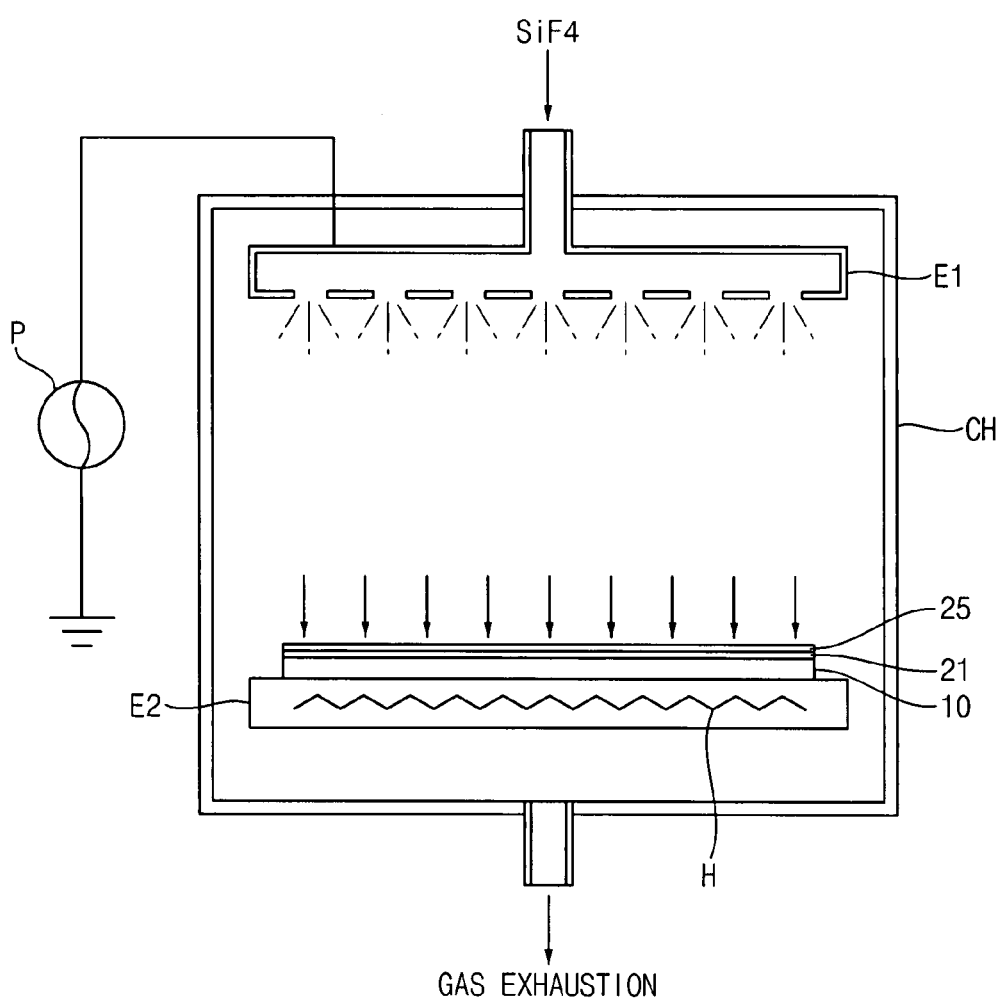
Figure 3:
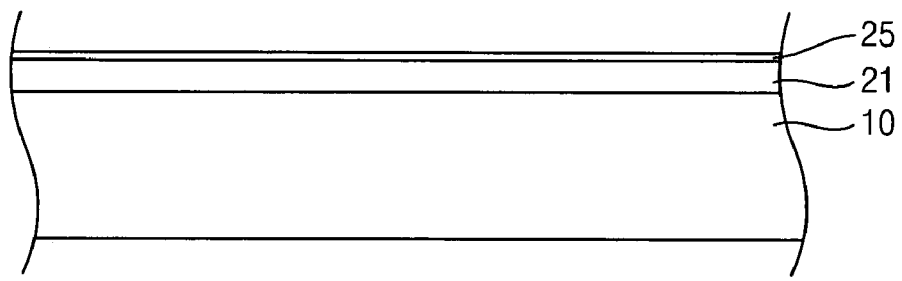
Figure 4:
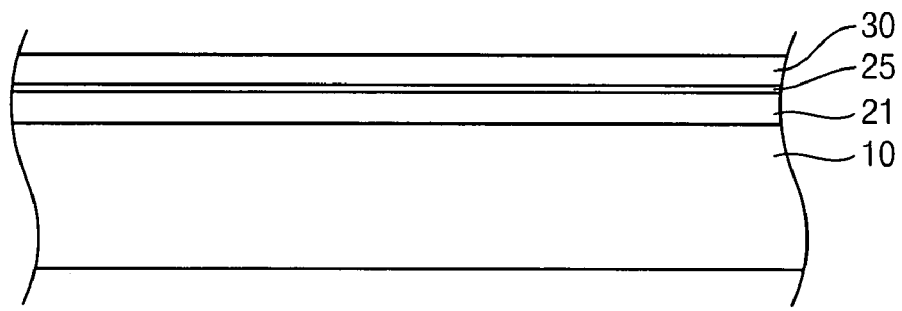

FIGS. 1 to 4 are cross-sectional views illustrating a method of forming a silicon layer in accordance with an exemplary embodiment of the present invention. FIG. 1 illustrated a silicon nitride layer 21 formed on a substrate 10. FIG. 2 illustrates a plasma pretreatment process of the silicon nitride layer 21. FIG. 3 illustrates the silicon nitride layer 25 which is plasma pretreated. Hereinafter, the plasma pretreated silicon nitride layer will be referred as 'an interface layer 25'. FIG. 4 illustrates a silicon layer 30 formed on an interface layer 25.

Referring to FIGS. 1 to 4, a method of manufacturing the silicon layer 30 includes plasma pretreatment process of the silicon nitride layer 21 and forming the silicon layer 30 on the silicon nitride layer 25. A surface of the silicon nitride layer 21 formed on the substrate 10 is pretreated through a plasma enhanced chemical vapor deposition (PECVD) process using a first reaction gas. Examples of the first reaction gas that can be used for pretreating the surface of the silicon nitride layer 21 include but are not limited to silicon tetrafluoride ($SiF_4$), nitrogen trifluoride ($NF_3$), and $SiF_4$—$H_2$. These can be used alone or in a combination thereof. The silicon layer 30 is formed on the silicon nitride layer 25 which is pretreated in a plasma enhanced chemical vapor deposition (PECVD) process using a second reaction gas. Examples of the second reaction gas that can be used for pretreating the silicon layer 30 formed on the silicon nitride layer 25 include but are not limited to silicon tetrafluoride ($SiF_4$), hydrogen ($H_2$), and argon (Ar). These can be used alone or in a combination thereof.

As illustrated in FIG. 1, the silicon nitride layer 21 is formed on the substrate 10. The substrate 10 may include, for example a glass substrate, and the silicon nitride layer 21 is deposited on the substrate 10 in a high-temperature chemical vapor deposition method, or a low-temperature chemical vapor deposition method. The silicon nitride layer 21 prevents water and sodium from diffusing into a silicon element. Thus, the silicon nitride layer 21 is used as a protective layer for protecting the substrate 10 from having the silicon device.

The substrate 10 including the silicon nitride layer 21 is pretreated by a plasma enhanced chemical vapor deposition device illustrated in FIG. 2. The plasma enhanced chemical vapor deposition device includes a chamber CH, a first electrode E1, a second electrode E2, a gas supply part and a power supply part P supplying a high frequency power to the first electrode E1. The first and second electrodes E1 and E2 face each other, and are disposed in the chamber CH.

The substrate 10 is disposed at the second electrode E2 that is electrically connected to a ground potential, and the first reaction gas is supplied to an inside of the chamber CH. A first high frequency power is applied to the first electrode E1. The first reaction gas includes but is not limited to silicon tetrafluoride ($SiF_4$), nitrogen trifluoride ($NF_3$), $SiF_4$—$H_2$ or a mixture thereof. The power supply part P may apply about 13.56 MHz radio frequency (RF) power to the first electrode E1.

When free electrons generated by a glow discharge between the first electrode E1 and the second electrode E2 receive enough energy and collide with molecules of the first reaction gas, ions of the first reaction gas are generated to form plasma. The ionized first reaction gas includes big energy and is reacted with the silicon nitride layer 21 as illustrated in FIG. 2. As a consequence, in FIG. 3, structure and properties of the surface of the silicon nitride layer 21 are changed to form the interface layer 25. Consequently, the thickness of the silicon nitride layer 21 is reduced to form the interface layer 25 on the substrate 10.

The structure and the properties of the interface layer 25 are changed corresponding to, for example, the plasma power, the chamber pressure, the gap between the first electrode E1 and the substrate 10, an amount of the first reaction gas, and a time of the pretreatment process. The interface layer 25 has a higher energy level than the silicon nitride layer 21 and unevenness is formed on the surface of the interface layer 25 by the plasma pretreatment process, so that the silicon layer 30 is formed more easily.

The silicon layer 30 is formed on the pretreated silicon nitride layer 25 using the plasma enhanced chemical vapor deposition device. For example, the silicon layer 30 may be formed on the interface layer 25 using the same plasma enhanced chemical vapor deposition device. The silicon layer 30 may be formed in situ. By-products and the plasma residue are exhausted from the chamber CH, and the second reaction gas is supplied into the chamber CH. Also, a second high frequency power is applied to the first electrode E1. The second reaction gas may include, for example, a mixture of silicon tetrafluoride ($SiF_4$), hydrogen ($H_2$) and argon (Ar).

Silicon tetrafluoride ($SiF_4$) ions and hydrogen ($H_2$) ions that are from the plasma mixture of silicon tetrafluoride ($SiF_4$), hydrogen ($H_2$), argon (Ar), electrons and neutrons are chemically reacted on the surface of the interface layer 25. Consequently, the silicon layer 30 is formed on the interface layer 25 as illustrated in FIG. The silicon layer 30 includes, for example, amorphous silicon and crystalline silicon. A degree of crystallization of the crystalline silicon may be greater than the amorphous silicon and may be smaller than poly silicon.

To use the silicon layer 30 as a semiconductor layer of a circuit device such as a thin film transistor, the silicon layer 30 should have an improved field effect mobility and stability of critical voltage. As the grain size of the silicon crystalline fraction and the size uniformity of the silicon crystals of the silicon layer 30 are increased, the properties of the silicon layer 30 as a semiconductor layer are likewise improved. The crystalline fraction of the silicon crystals is defined herein as the volume ratio of the silicon crystal to the silicon crystal 30.

The crystalline fraction of the silicon layer 30 and the uniformity of the grain size of the silicon crystal depend on the structure and the property of the interface layer 25. The structure and the property of the interface layer 25 depend on the plasma pretreatment of the silicon nitride layer 21. As mentioned above, the structure and the property of the interface layer 25 are changed based on, for example, the plasma power, the chamber pressure, the gap between the first electrode E1 and the second electrode E2, the kind of the first reaction gas, the amount of the first reaction gas, and the time of the pretreatment process, in the plasma pretreatment process.

FIGS. 5A to 5G are images illustrating silicon layers formed on a surface of an interface layer in accordance with another exemplary embodiment of the present invention using different gases from each other.

FIGS. 5A to 5G are images of the silicon layer 30 formed on the interface layer 25. The surface of the silicon nitride layer 21 was pretreated using various kinds of the first reaction gas in a process condition. The plasma power, the chamber pressure, the gap between the electrodes, and the amount of the first reaction gas and the time of the process condition for pretreating the surface of the silicon nitride layer 21 were about 600 W/cm$^2$, about 1.2 Torr about 18 mm, about 300 standard cubic centimeters per minute (sccm) and about 120 seconds, respectively. The pretreated silicon nitride layer 21 was formed on the interface layer 25 in a process condition. The plasma power, the chamber pressure, the gap between the electrodes, the substrate temperature and the ratio amount of silicon tetrafluoride ($SiF_4$):hydrogen ($H_2$):argon (Ar) of the process condition for forming the silicon layer 30 were about 210 mW/cm$^2$, about between 3 to 5 Torr, about 18 mm, about 220° C. and about 50:750:500.

Figure 5A:
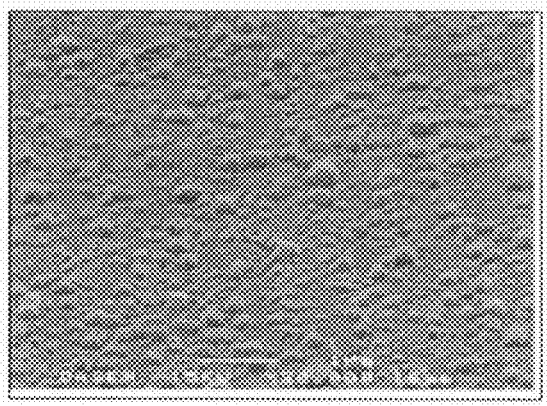
FIGS. 5A to 5G are images illustrating silicon layers formed on a surface of an interface layer in accordance with an exemplary embodiment of the present invention using different gases from each other.
Figure 5B:
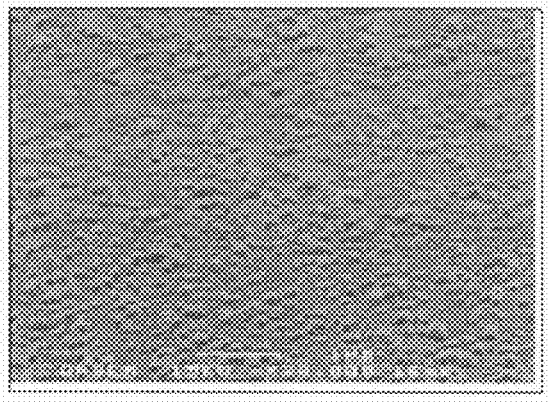
Figure 5C:
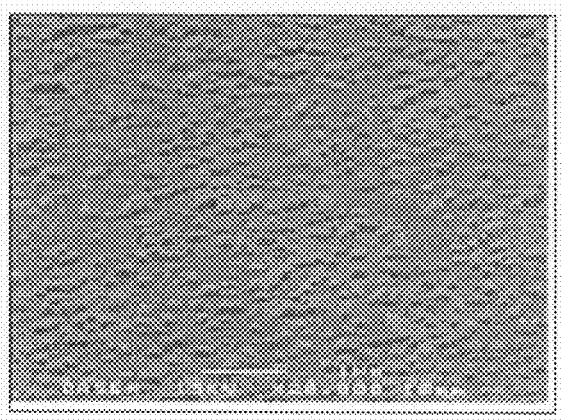
Figure 5D:
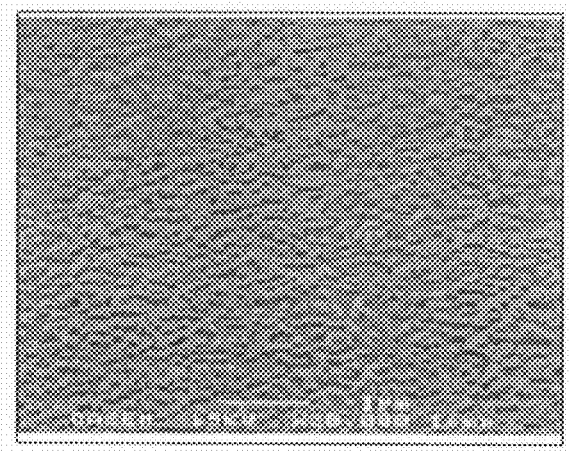
Figure 5E:
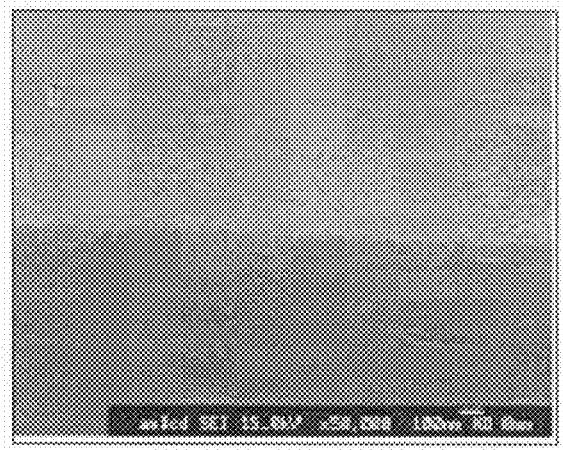
Figure 5F:
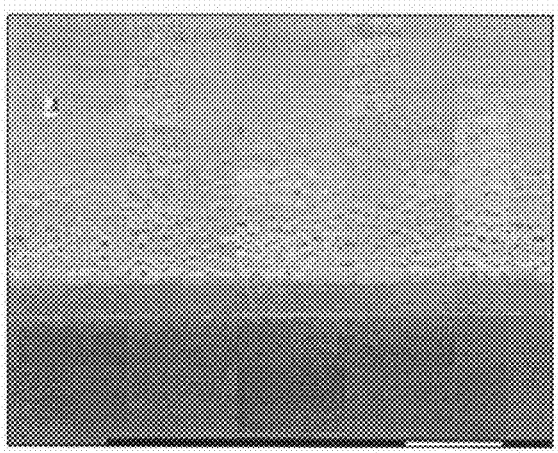
Figure 5G:
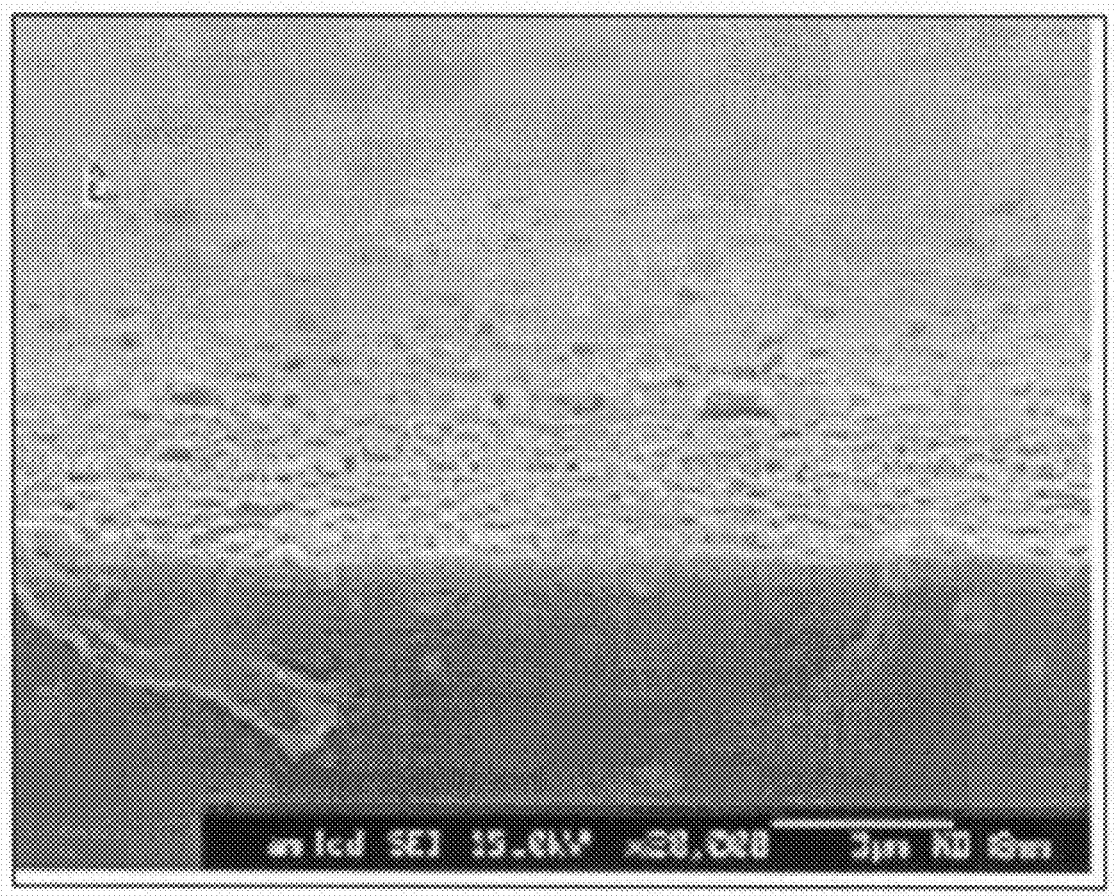

The first reaction gas was nitrogen (N2) in FIG. 5A. The first reaction gas was nitrogen trifluoride ($NF_3$) in FIG. 5S. The first reaction gas was $SiF_4/H_2$ in FIG. 5C. The first reaction gas was silicon tetrafluoride ($SiF_4$) in FIGS. 5D and 5E. The first reaction gas was hydrogen ($H_2$) in FIG. 5F. The plasma pretreatment was omitted in FIG. 5G. An image of FIG. 5D illustrates the silicon layer 30 formed in a process condition, and the ratio amount of silicon tetrafluoride ($SiF_4$): hydrogen ($H_2$):argon (Ar) was about 50:750:500. An image of FIG. 5E illustrates the silicon layer 30 formed in a different process condition concerning the ratio amount of silicon tetrafluoride ($SiF_4$):hydrogen ($H_2$):argon (Ar) of FIG. 5E was different from that of FIGS. 5A to 5D.

Table I represents the above experiment data.

TABLE I

| | Gas | | | | |
|---|---|---|---|---|---|
| | $N_2$ | $NF_3$ | $SiF_4$—$H_2$ | $H_2$ | $SiF_4$ |
| Crystalline fraction | 74-75% | 75% | 70% | ~50% | 72% |
| Uniformity of grain sizes | Bad | Good | Good | Better | Best |
| Uniformity of depositions | Good | Bad | Good | Good | Good |

Referring to FIGS. 5A to 5G and Table I, a surface structure of the silicon layer 30 was changed based on the gas used for the plasma pretreatment of the silicon nitride layer 21.

The silicon crystalline fraction of the nitrogen N2 plasma pretreatment illustrated in FIG. 5A was about 72%. The silicon crystalline fraction of the nitrogen trifluoride ($NF_3$) plasma pretreatment illustrated in FIG. 5 was about 75%. The silicon crystalline fraction of the $SiF_4$—$H_2$ plasma pretreatment illustrated in FIG. 5C was about 70%. The silicon crystalline fraction of the silicon tetrafluoride ($SiF_4$) plasma pretreatment illustrated in FIG. 5D was about 72%. The silicon crystalline fraction of the silicon tetrafluoride ($SiF_4$) plasma pretreatment illustrated in FIG. 5E was about 64%. The silicon crystalline fraction of the hydrogen ($H_2$) plasma pretreatment illustrated in FIG. 5F was about 50%. The silicon crystalline fraction without any plasma pretreatment illustrated in FIG. 5G was about 66%.

As the kind of the reaction gas was changed, the grain size uniformity of the silicon crystals and the deposition uniformity of the silicon crystals were changed significantly.

A non-uniformity grain size of the silicon crystal deteriorates the normal operation of a thin film transistor formed on a display substrate. As a result, the color reproducibility of the display apparatus may also be deteriorated. Thus, a more uniform grain size with a low crystalline fraction may be better than a non-uniform grain size with a high crystalline fraction.

Referring to FIGS. 5A to 5G, when the plasma pretreatment used the nitrogen (N2) gas as the first reaction gas, the crystalline fraction was significantly increased but the grain size was non-uniform. When the silicon nitride layer 21 was pretreated with the silicon tetrafluoride ($SiF_4$) gas as the first reaction gas, the crystalline fraction of the silicon crystal, the grain size uniformity of the silicon crystal and the deposition uniformity of the silicon crystal of the silicon layer 30 were improved.

Thus, in the process condition of the plasma pretreatment process and the silicon forming process, the plasma pretreatment process may be used in a process condition, in which silicone tetrafluoride ($SiF_4$) was the first reaction gas. In addition, the plasma power, the chamber pressure, the gap between the electrodes, the amount of the gas and the pretreatment time were between about 540 to about 660 W/cm$^2$, between about 1.1 to about 1.3 Torr, between about 16 to about 20 millimeters (mm), between about 270 to about 330 sccm and between about 108 to about 132 seconds, respectively.

Moreover, the process forming the silicon layer 30 may be performed under a process condition, in which the plasma power, the chamber pressure, the gap between the electrodes, the substrate temperature and the ratio amount of silicon tetrafluoride ($SiF_4$):hydrogen ($H_2$):argon (Ar) were between about 190 to about 230 mW/cm$^2$, between about 3 to about 4 torr, between about 16 to about 20 mm, between about 198 and about 242° C. at and between about 45 to about 55: between about 675 to about 825: and between about 450 to about 550, respectively.

Method of Display Substrate

Figure 6:
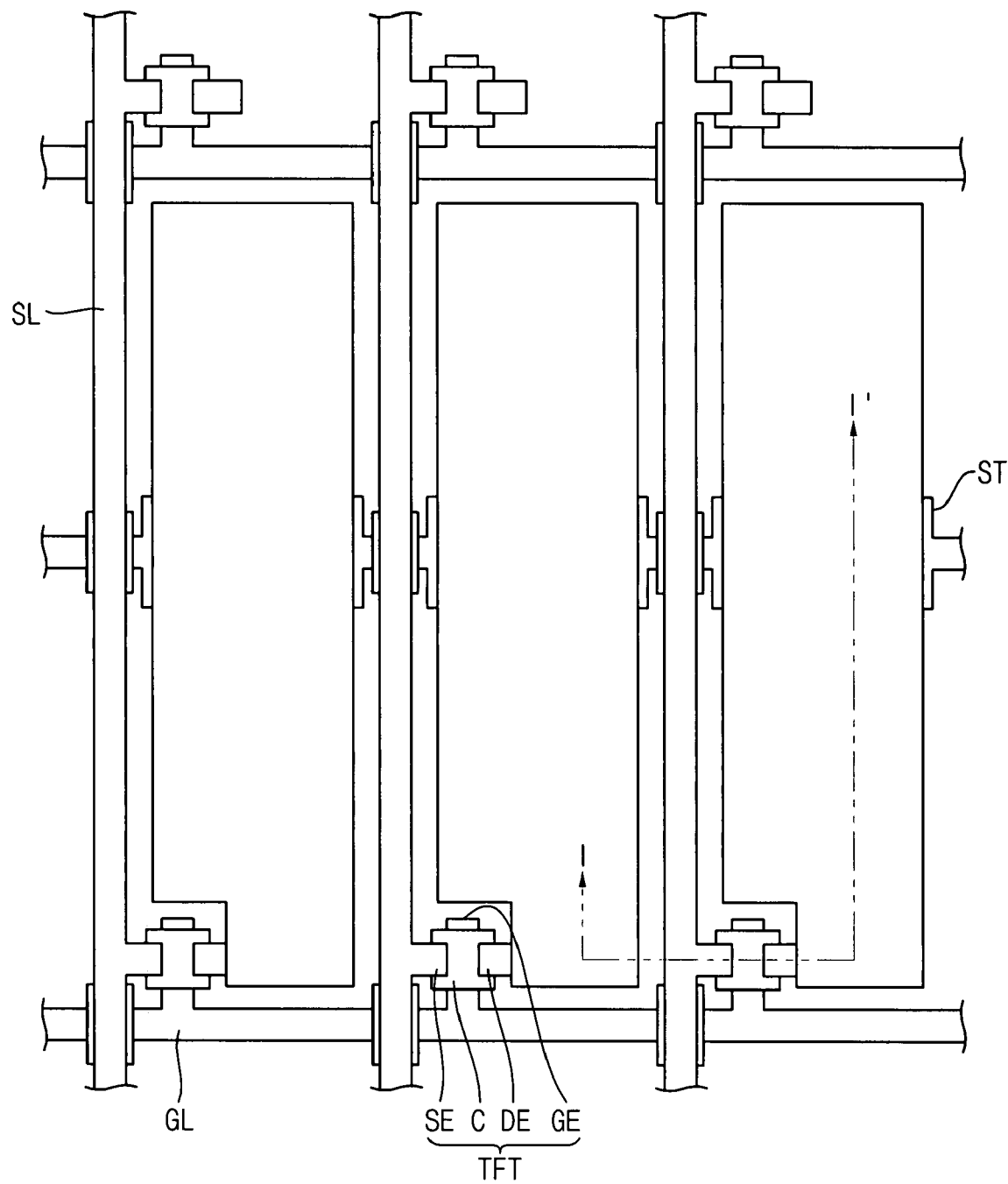
FIG. 6 is a plan view illustrating a display substrate manufactured by a method of manufacturing a display substrate in accordance with an exemplary embodiment of the present invention.

FIG. 6 is a plain view illustrating a display substrate manufactured by a method of manufacturing a display substrate in accordance with another exemplary embodiment of the present invention. FIGS. 7 to 11 are cross-sectional views illustrating the display substrate illustrated in FIG. 6. In particular, FIGS. 7 to 11 are cross-sectional views taken along the line I-I' of FIG. 6, and FIGS. 7 to 11 are cross-sectional views illustrating the method of manufacturing the display substrate shown in FIG. 6.

Referring to FIGS. 6 to 11, a method of manufacturing a display substrate includes forming a gate wiring GL and a gate electrode GE on a substrate 310, forming a silicon layer 321 covering the gate wiring GL and the gate electrode GE, performing a plasma pretreatment of a surface of the silicon nitride layer 321 in a plasma enhanced chemical vapor deposition method using a first reaction gas including, for example, silicon tetrafluoride ($SiF_4$) gas, forming a channel layer C including silicon crystal on the silicon nitride layer 321 pretreated in a plasma enhanced chemical vapor deposition method using a second reaction gas including, for example, a mixture of gas such as silicon tetrafluoride ($SiF_4$), hydrogen ($H_2$) and argon (Ar) and forming a source electrode SE and a drain electrode DE on the channel layer C.

Figure 7:
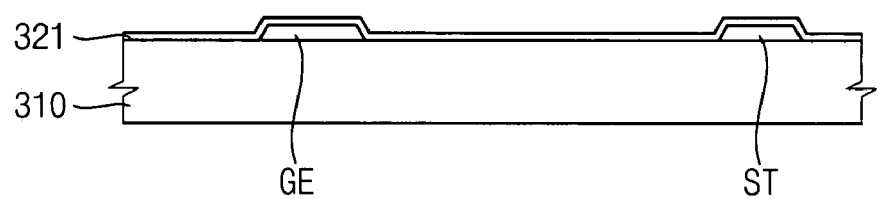
FIGS. 7 to 11 are cross-sectional views illustrating a method of manufacturing the display substrate illustrated in FIG. 6.

As illustrated in FIGS. 6 and 7, a gate metal is deposited on a glass substrate 310 by a sputtering method, and the gate wiring GL and the gate electrode GE are formed by a photolithography process and an etching process. The gate wiring GL and the gate electrode GE may include, for example, aluminum (Al), molybdenum (Mo), titanium (Ti), tungsten (W), chromium (Cr), silver (Ag) and so on.

A gate insulation layer 321 covering the entire or substantially the entire substrate 310 including the gate wiring GL and the gate electrode GE is formed. The gate insulation 321 may include, for example, a silicon nitride layer.

Figure 8:
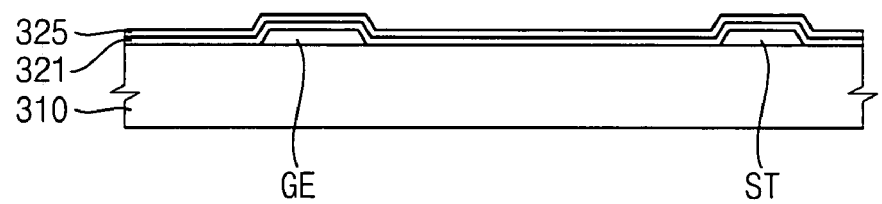

Referring to FIG. 8, a surface of the silicon nitride layer 321 is a plasma pretreated by a plasma enhanced chemical vapor deposition method using the first reaction gas including silicon tetrafluoride ($SiF_4$) gas in substantially the same chamber as the process for forming the gate insulation layer 321. The plasma pretreatment process is substantially the same as the plasma pretreatment process in FIGS. 1 to 5G.

The plasma pretreatment process may be performed under a process condition, in which the plasma power, a chamber pressure, a gap between electrodes, an amount of gas and a pretreatment time are between about 540 to about 660 W/cm$^2$ between about 1.1 to 1.3 about Torr, between about 16 to about 20 mm, between about 270 to about 330 sccm and between about 108 to about 132 seconds, respectively.

For example, the plasma pretreatment process may be performed under a process condition, in which the plasma power, the chamber pressure, the gap between electrodes and the amount of gas are about 600 W/cm$^2$ about 1.2 Torr, about 18 mm, about 300 sccm and about 120 seconds, respectively.

The structure and the properties of the silicon nitride layer 321 are changed by the plasma pretreatment. The changed silicon nitride layer forms an interface layer 325. Thus, the interface layer 325 is formed on a surface of the gate insulation 321 by the plasma pretreatment. For example, the interface layer 325 may be formed on a surface of the silicon nitride layer 321 by the plasma pretreatment.

Figure 9:
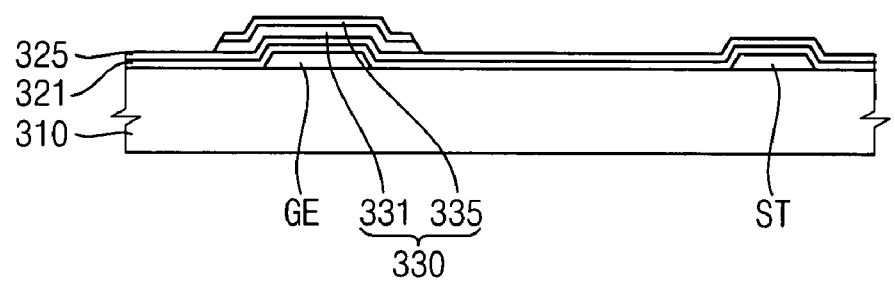

A semiconductor layer 330 including silicon crystal on the interface layer 321 as illustrated in FIG. 9 is formed by a plasma enhanced chemical vapor deposition method using a second reaction gas including, for example, a mixture of gas such as silicon tetrafluoride (SiF$_4$), hydrogen (H$_2$) and argon (Ar). The semiconductor layer 330 includes a silicon layer 331 and a resistant contact layer 335. A 13.56 MHz plasma enhanced chemical vapor deposition reactor is used in the plasma pretreatment process and forming the semiconductor layer 330.

The silicon layer 331 formed by the second reaction gas and the resistant contact layer 335 implanted by an n-type are deposited in sequence. The silicon layer 331 includes for example, amorphous silicon and crystalline silicon. A structure and a property of the silicon layer 331 is substantially the same as the silicon layer 331 of FIG. 5D. Doping gas is added to the second reaction gas. For example, phosphine (PH3) may be added to the second reaction gas. Consequently the resistant contact layer 335 is implanted by phosphorus (P), which is a group 5A element.

The silicon layer 331 and the resistant contact layer 335 are removed and the channel layer C is formed in a remaining area except an area in which a thin film transistor will be formed and an area in which the gate wiring GL, a storage capacitor wiring ST and a source wiring SL are crossed with each other.

Figure 10:
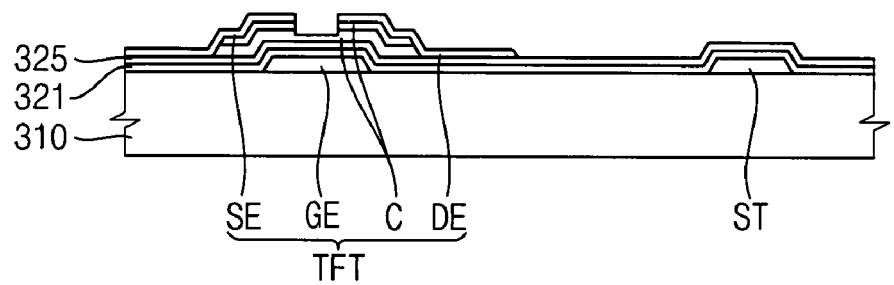

Referring to FIGS. 6 and 10, the source wiring SL crossing the gate wiring GL is formed on the substrate 310 including the channel layer C, and the source electrode SE and the drain electrode DE are formed on an area of the channel layer C corresponding to the gate electrode GE.

Figure 11:
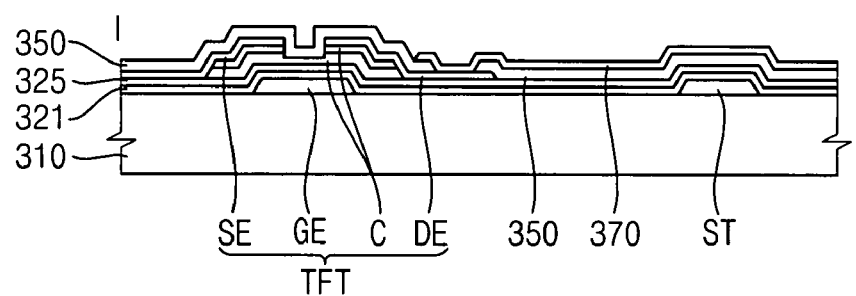

Referring to FIGS. 6 and 11, a method of manufacturing the display substrate includes forming a passivation layer 350 on the substrate 310 having the source electrode SE and the drain electrode DE and forming a pixel electrode 370 electrically connected to the drain electrode DE through a contact hose formed on the passivation layer 350.

The pixel electrode includes a transparent conductive material. For example, the pixel electrode may include indium tin oxide (ITO), indium zinc oxide (IZO) or indium tin zinc oxide.

Figure 12:
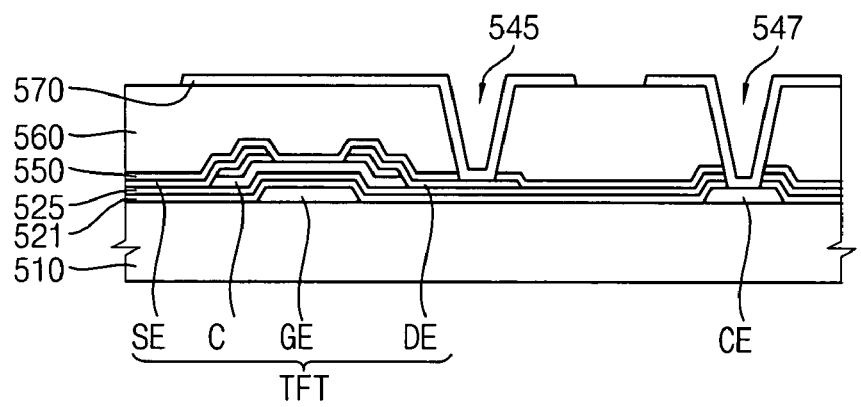
FIG. 12 is a plan view illustrating a method of manufacturing a display substrate in accordance with an exemplary embodiment of the present invention.

FIG. 12 is a plan view illustrating a method of manufacturing a display substrate in accordance with another exemplary embodiment of the present invention. In particular, FIG. 12 illustrates a substrate using an active matrix organic emitting diode AMOLED.

Referring to FIG. 12, a gate electrode GE is formed on a substrate 510. The gate electrode GE may include, for example, aluminum (Al), molybdenum (Mo), tantalum (Ta), titanium (Ti), tungsten (W), chromium (Cr), silver (Ag) and so on. The gate electrode GE may include two layers having different physical characteristics from each other. The lower metallic layer may include a metallic material having a low specific resistance, which improves the delay of a gate signal and the drop of a voltage. For example, the lower metallic layer may include a metallic material based on aluminum such as aluminum (Al) or an aluminum alloy implanted with neodymium (Nd) and so on. An upper metallic layer may include a different material from the lower metallic layer. The upper metallic layer may include a material which has improved electrical contact characteristic with ITO or IZO and does not have such a different etching speed from the lower metallic layer. The upper metallic layer may include, for example, molybdenum (Mo), molybdenum nitride (MoN) or molybdenum alloy (Mo-alloy). A side surface of the gate wiring is inclined, and the side surface is inclined at between about 30 to about 80 degrees with respect to the substrate 510.

An auxiliary electrode CE is formed from substantially the same layer as the gate electrode GE. The auxiliary electrode CE includes substantially the same material as the gate electrode GE.

A gate insulation layer 521 including, for example, a silicon nitride covering the gate electrode GE on the gate electrode GE is formed.

A surface of the gate insulation layer 521 is pretreated by a plasma enhanced chemical vapor deposition pretreatment (PECVD) method using SiF$_4$ gas as the first reaction gas in substantially the same chamber as the chamber used in the process forming the gate insulation layer 521. For example, a surface of the silicon nitride layer 521 may be pretreated by a plasma enhanced chemical vapor deposition pretreatment (PECVD) method using SiF$_4$ gas as the first reaction gas in substantially the same chamber as the chamber used in the process forming the gate insulation layer 521. The plasma pretreatment process is substantially the same as the plasma pretreatment process of FIGS. 1 to 5G.

The plasma pretreatment process is performed under a process condition, in which the plasma power, the chamber pressure, the gap between electrodes and the amount of gas are about 600 W/cm$^2$, about 1.2 Torr, about 18 mm, about 300 sccm and about 120 seconds, respectively. The structure and the properties of the silicon nitride layer 521 are changed by the plasma pretreatment. The changed silicon nitride layer forms an interface layer 525. Thus, the interface layer 525 is formed on a surface of the gate insulation 521 by the plasma pretreatment. For example, the interface layer 355 may be formed on a surface of the silicon nitride layer 521 by the plasma pretreatment.

A channel layer C including silicon crystal on the pretreated silicon nitride layer is formed in a plasma enhanced chemical vapor deposition method using the second reaction gas including, for example, a mixture of gas such as silicon tetrafluoride (SiF$_4$), hydrogen (H$_2$) and argon (Ar). For example, the channel layer C including silicon crystal on the interface layer 525 may be formed in a plasma enhanced chemical vapor deposition method using the second reaction gas including a mixture of gas such as silicon tetrafluoride (SiF$_4$), hydrogen (H$_2$) and argon (Ar). The channel layer C includes a silicon layer and a resistant contact layer formed on the silicon layer. A forming process of the channel layer C uses substantially the same chamber as the chamber in which the plasma pretreatment process is performed. The silicon layer using the second reaction gas and the resistant contact layer implanted as n-type are deposited, in sequence. The silicon layer includes, for example, an amorphous silicon and a crystallized silicon. The structure and properties of the silicon are substantially the same as the silicon layer illustrated in FIG. 5D. The resistant contact layer is implanted by phosphorus (P) which is a group 5A element.

A source electrode SE and a drain electrode DE are formed on the resistant contact layer and the gate insulation layer 521. The source electrode SE and the drain electrode DE may be formed as a multi-layer structure. For example, the source electrode SE and the drain electrode DE may include a first metallic layer having molybdenum-niobium (MoNb), a second metallic layer having an aluminum alloy and a third metallic layer having molybdenum-niobium (MoNb). The gate electrode GE, the source electrode SE and the drain electrode DE with an exposure part of the channel layer C form a thin film transistor.

A passivation layer 550 is formed on the source electrode SE, the drain electrode DE and the exposed channel layer C. The passivation layer 550 may include an organic material having an improved planarization characteristic and photosensitivity or an insulation material having a low dielectric constant and formed by a plasma enhanced chemical vapor deposition (PECVD) such as, for example, amorphous silicon (a-Si):carbonate (C):oxygen (O), amorphous silicon (a-Si):oxygen (O):fluorine (F). When the passivation layer 550 includes an organic material, a non-organic insulation layer having silicon nitride (SiNx) or silicon oxide (SiO2) may be further formed under the organic layer, so that the organic material is prevented from a direct contact with the exposure part of the channel layer C.

A planarization layer 560 is formed on the passivation layer 550. The planarization layer 560 planarizes the surface of the substrate 510 including the thin film transistor, so that an organic layer, which will be formed later, is formed flatly and emits tight. The planarization layer may include an organic layer such as, for example, a silicon nitride layer, or a silicon oxide.

A contact hole exposing the source electrode SE and an auxiliary electrode 130 is formed by etching the interface layer 525, the silicon nitride layer 521, the passivation layer 550 and the planarization layer 560.

A pixel electrode 570 is formed on the planarization layer 560. The pixel electrode 570, for example, may include a reflexibility metallic layer such as chromium (Cr), molybdenum (Mo), aluminum (Al), silver (Ag), or gold (Au), a transparent conductive layer such as ITO, IZO, a multi-layered layer depositing ITO or IZO on a upper and/or a lower layer of the reflexibility metallic layer. The pixel electrode 570 is patterned to be substantially formed as, for example, a rectangular shape, a circle shape, an ellipse shape in a plane view.

According to the above, a silicon nitride layer, which is a gate insulation layer, is pretreated in a plasma enhanced chemical vapor deposition method of a specific process condition using $SiF_4$ as a reaction gas, so that a semiconductor layer having improved characteristics as a semiconductor layer compared to an amorphous silicon layer is formed.

Moreover, the above-mentioned plasma enhanced chemical vapor process method used in the thin film transistor forming process of the exemplary embodiments of the present invention, not only provides a thin film transistor which has improved characteristics as a semiconductor layer compared to an amorphous silicon layer but also needs less processing equipment, than conventional methods, such as for example, a low temperature poly-silicon technology (LTPS) method, for forming a semiconductor layer having silicon crystal. An amorphous silicon layer is changed to poly-silicon by a laser in the LTPS method.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of forming a silicon layer, comprising:
    pretreating a surface of a silicon nitride layer formed on a substrate through a plasma enhanced chemical vapor deposition method using a first reaction gas including at least one gas selected from the group consisting of silicon tetrafluoride ($SiF_4$) gas, $SiF_4$—$H_2$ gas and a mixture thereof; and
    forming a silicon layer on the pretreated silicon nitride layer through a plasma enhanced chemical vapor deposition method using a second reaction gas including a mixture of gas including silicon tetrafluoride ($SiF_4$), hydrogen ($H_2$) and argon (Ar).

2. The method of claim 1, wherein the first reaction gas comprises the silicon tetrafluoride ($SiF_4$) gas, and the plasma pretreatment is performed under a process condition, in which a plasma power, a chamber pressure, a gap between electrodes, an amount of gas and a pretreatment time are between about 540 to about 660 $W/cm^2$, between about 1.1 to about 1.3 Torr, between about 16 to about 20 mm, between about 270 to about 330 sccm and between about 108 to about 132 seconds, respectively.

3. The method of claim 2, wherein the plasma pretreatment is performed under a process condition, in which a plasma power, a chamber pressure, a gap between electrodes and an amount of gas and a pretreatment time are about 600 $W/cm^2$, about 1.2 Torr, about 18 mm, about 300 sccm and about 120 second, respectively.

4. The method of claim 2, wherein the forming of the silicon layer is performed under a process condition, in which a plasma power, a chamber pressure, a gap between electrodes, a temperature of a substrate and a ratio of an amount of silicon tetrafluoride ($SiF_4$):hydrogen ($H_2$):argon (Ar) are between about 190 to about 230 $W/cm^2$, between about 3 to about 4 Torr, between about 16 to about 20 mm, between about 198 to about 242 degrees and between about 45 to about 55: between about 675 to about 825: between about 450 to about 550, respectively.

5. The method of claim 4, wherein the forming of the silicon layer is performed under a process condition, in which the plasma power, the chamber pressure, the gap between electrodes, the temperature of a substrate and the ratio of the amount of silicon tetrafluoride ($SiF_4$):hydrogen ($H_2$):argon (Ar) are about 210 $W/cm^2$, between about 3 to about 5 Torr, about 18 mm, about 220 degrees and about 50:750:500.

6. The method of claim 5, wherein the plasma pretreatment and the forming of the silicon layer are performed in the same chamber, in sequence.

7. A method of manufacturing a display panel, comprising:
    forming a gate wiring and a gate electrode on a substrate;
    forming a silicon nitride layer covering the gate wiring and the gate electrode;
    performing a plasma pretreatment of a surface of the silicon nitride layer in a plasma enhanced chemical vapor deposition method using a first reaction gas including silicon tetrafluoride ($SiF_4$);
    forming a semiconductor layer including silicon crystals on the pretreated silicon nitride layer through a plasma enhanced chemical vapor deposition method using a second reaction gas including a mixture of gas including silicon tetrafluoride ($SiF_4$), hydrogen ($H_2$) and argon (Ar); and
    forming a source wiring crossing the gate wiring, a source electrode and a drain electrode on the semiconductor layer.

8. The method of claim 7, further comprising:

forming a passivation layer on the substrate including the source electrode and the drain electrode; and forming an electrode electrically connected to the drain electrode.

9. The method of claim 7, wherein the performing of the plasma pretreatment and the forming of the silicon layer are proceeded by an about 13.56 MHz plasma enhanced chemical vapor deposition reactor.

* * * * *